(12) United States Patent
Choi et al.

(10) Patent No.: US 11,881,474 B2
(45) Date of Patent: Jan. 23, 2024

(54) DISPLAY DEVICE

(71) Applicant: Samsung Display Co., LTD., Yongin-si (KR)

(72) Inventors: Jin Woo Choi, Yongin-si (KR); Min Woo Kim, Yongin-si (KR); Dae Ho Song, Yongin-si (KR); Byung Choon Yang, Yongin-si (KR); Hyung Il Jeon, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 287 days.

(21) Appl. No.: 17/369,344

(22) Filed: Jul. 7, 2021

(65) Prior Publication Data

US 2022/0013514 A1 Jan. 13, 2022

(30) Foreign Application Priority Data

Jul. 10, 2020 (KR) .......................... 10-2020-0085696

(51) Int. Cl.
*H01L 25/16* (2023.01)
*H01L 33/62* (2010.01)

(52) U.S. Cl.
CPC ............ *H01L 25/167* (2013.01); *H01L 33/62* (2013.01)

(58) Field of Classification Search
CPC ... H01L 25/167; H01L 33/62; H01L 25/0753; H01L 27/156; H01L 21/76895; H01L 25/0652; H01L 27/1214; G09G 3/3208; H10K 59/122; H10K 59/131
See application file for complete search history.

(56) References Cited

U.S. PATENT DOCUMENTS

| | | | |
|---|---|---|---|
| 8,851,682 B2 | 10/2014 | Tanigawa et al. | |
| 2020/0005703 A1* | 1/2020 | Kim | ........................ G09G 3/32 |
| 2020/0006445 A1* | 1/2020 | Hong | ..................... H10K 50/15 |
| 2020/0043906 A1 | 2/2020 | Kuo et al. | |
| 2020/0381474 A1* | 12/2020 | Choi | ....................... H01L 33/44 |
| 2022/0069003 A1* | 3/2022 | Lee | ....................... H01L 33/387 |

FOREIGN PATENT DOCUMENTS

JP 5643720 12/2014
WO 2020/080603 4/2020

* cited by examiner

*Primary Examiner* — Victor A Mandala
(74) *Attorney, Agent, or Firm* — KILE PARK REED & HOUTTEMAN PLLC

(57) ABSTRACT

A display device includes pixels each of which includes a first pixel electrode; a first connection electrode disposed on the first pixel electrode; a second connection electrode spaced apart from the first pixel electrode; a second pixel electrode disposed on the second connection electrode; first light emitting elements disposed between the first pixel electrode and the first connection electrode; and second light emitting elements disposed between the second connection electrode and the second pixel electrode. The first connection electrode is electrically connected to the second connection electrode.

15 Claims, 7 Drawing Sheets

DISPLAY DEVICE

CROSS-REFERENCE TO RELATED APPLICATION(S)

This application claims priority to and benefits of Korean patent application 10-2020-0085696 under 35 U.S.C. § 119 filed on Jul. 10, 2020 in the Korean Intellectual Property Office, the entire contents of which are incorporated herein by reference.

BACKGROUND

1. Technical Field

The disclosure generally relates to a display device.

2. Description of the Related Art

Interest in information displays has recently increased. Accordingly, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide a display device having improved light emission efficiency.

In accordance with an aspect of the disclosure, there is provided a display device that may include a plurality of pixels, wherein each of the plurality of pixels may include a first pixel electrode; a first connection electrode disposed on the first pixel electrode; a second connection electrode spaced apart from the first pixel electrode; a second pixel electrode disposed on the second connection electrode; a plurality of first light emitting elements disposed between the first pixel electrode and the first connection electrode; and a plurality of second light emitting elements disposed between the second connection electrode and the second pixel electrode The first connection electrode may be electrically connected to the second connection electrode.

The first pixel electrode and the second connection electrode of each of the plurality of pixels may be disposed on a same layer.

The first connection electrode and the second pixel electrode of each of the plurality of pixels may be disposed on a same layer.

The display device may further include an insulating layer disposed over the first pixel electrode and the second connection electrode of each of the plurality of pixels.

The first connection electrode of each of the plurality of pixels may electrically contact the second connection electrode of each of the plurality of pixels through a contact hole penetrating the insulating layer.

The plurality of first light emitting elements may constitute a first serial stage in which the plurality of first light emitting elements may be electrically connected in parallel between the first pixel electrode and the first connection electrode of each of the plurality of pixels, and the plurality of second light emitting elements may constitute a second serial stage in which the plurality of second light emitting elements may be electrically connected in parallel between the second connection electrode and the second pixel electrode of each of the plurality of pixels.

Each of the plurality of first light emitting elements may include a first semiconductor layer, a second semiconductor layer disposed on the first semiconductor layer, and an intermediate layer disposed between the first semiconductor layer and the second semiconductor layer.

The first connection electrode of each of the plurality of pixels may be directly disposed on the second semiconductor layer of each of the plurality of first light emitting elements.

The first semiconductor layer of each of the plurality of first light emitting elements may be electrically connected to the first pixel electrode of each of the plurality of pixels, and the second semiconductor layer of each of the plurality of first light emitting elements may be electrically connected to the first connection electrode of each of the plurality of pixels.

The display device may further include a first contact electrode disposed between the first pixel electrode of each of the plurality of pixels and the first semiconductor layer of each of the plurality of first light emitting elements.

Each of the plurality of second light emitting elements may include a first semiconductor layer, a second semiconductor layer disposed on the first semiconductor layer, and an intermediate layer disposed between the first semiconductor layer and the second semiconductor layer.

The second pixel electrode of each of the plurality of pixels may be directly disposed on the second semiconductor layer of each of the plurality of second light emitting elements.

The first semiconductor layer of each of the plurality of second light emitting elements may be electrically connected to the second connection electrode of each of the plurality of pixels, and the second semiconductor layer of each of the plurality of second light emitting elements may be electrically connected to the second pixel electrode of each of the plurality of pixels.

The display device may further include a second contact electrode disposed between the second connection electrode of each of the plurality of pixels and the first semiconductor layer of each of the plurality of second light emitting elements.

The display device may further include a first power line electrically connected to the first pixel electrode of each of the plurality of pixels; and a second power line electrically connected to the second pixel electrode of each of the plurality of pixels.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

In the drawings:

FIGS. 1 and 2 are a perspective view and a schematic cross-sectional view illustrating a light emitting element in accordance with an embodiment.

FIG. 3 is a plan view illustrating a display device in accordance with an embodiment.

FIGS. 4 and 5 are equivalent circuit diagrams illustrating a pixel in accordance with an embodiment.

FIG. 6 is a schematic plan view of a pixel in accordance with an embodiment.

FIG. 7 is a schematic cross-sectional view taken along line A-A' shown in FIG. 6.

FIG. 8 is a schematic cross-sectional view of a pixel in accordance with an embodiment.

DETAILED DESCRIPTION OF THE EMBODIMENTS

Figure 1:
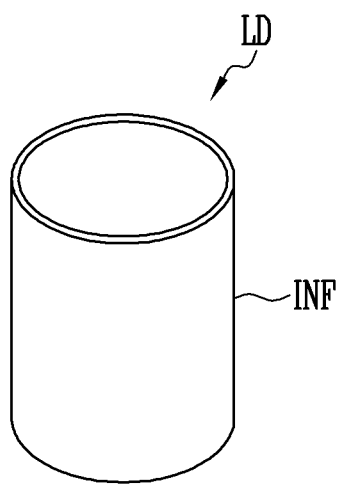

The effects and characteristics of the disclosure and a method of achieving the effects and characteristics will be clear by referring to the embodiments described below in detail together with the accompanying drawings. However, the disclosure is not limited to the embodiments disclosed herein but may be implemented in various forms. The embodiments are provided by way of example only so that one of ordinary skill in the art can fully understand the features in the disclosure and the scope thereof. Therefore, the disclosure can be defined by the scope of the appended claims.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The terminology used herein is for the purpose of describing embodiments only and is not construed as limiting the disclosure. As used herein, the singular forms are intended to include the plural forms as well, unless the context clearly indicates otherwise. The terms "comprises/includes" and/or "comprising/including," and/or "has/"have"/"having" and their variations when used in this specification, specify the presence of mentioned component, step, operation and/or element, but do not exclude the presence or addition of one or more other components, steps, operations and/or elements.

When described as that any element is "connected", "coupled" or "accessed" to another element, it should be understood that it is possible that still another element may "connected", "coupled" or "accessed" between the two elements as well as that the two elements are directly "connected", "coupled" or "accessed" to each other.

The term "on" that is used to designate that an element or layer is on another element or layer includes both a case where an element or layer is located or disposed directly on another element or layer, and a case where an element or layer is located or disposed on another element or layer via still another element layer. Like reference numerals generally denote like elements throughout the specification.

It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the teachings of the disclosure.

Also, "under", "below", "above", "upper", and the like are used for explaining relation association of components illustrated in the drawings. The terms may be a relative concept and described based on directions expressed in the drawings.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the term "unit" denotes a structure or element as illustrated in the drawings and as described in the specification. However, the disclosure is not limited thereto. The term "unit" is not to be limited to that which is illustrated in the drawings.

Unless otherwise defined, all terms (including technical and scientific terms) used herein have the same meaning as generally understood by those skilled in the art. Terms as defined in a commonly used dictionary should be construed as having the same meaning as in an associated technical context, and unless defined apparently in the description, the terms are not ideally or excessively construed as having formal meaning.

Hereinafter, embodiments will be described in more detail with reference to the accompanying drawings.

Figure 2:
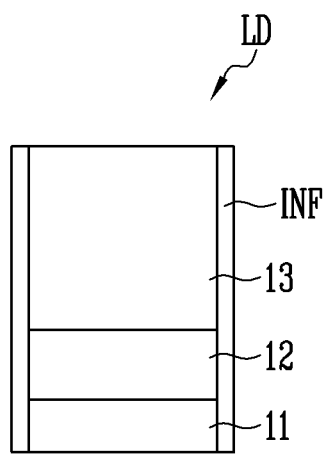

FIGS. 1 and 2 are a perspective view and a schematic cross-sectional view illustrating a light emitting element in accordance with an embodiment. Although a rod type light emitting element LD having a substantially cylindrical shape is illustrated in FIGS. 1 and 2, the kind and/or shape of the light emitting element LD is not limited thereto.

Referring to FIGS. 1 and 2, the light emitting element LD may include a first semiconductor layer 11, a second semiconductor layer 13, and an intermediate layer 12 interposed or disposed between the first and second semiconductor layers 11 and 13. In an example, the light emitting element LD may be formed as a stack structure in which the first semiconductor layer 11, the intermediate layer 12, and the second semiconductor layer 13 may be sequentially stacked.

In an embodiment, the light emitting element LD may be provided in a substantially rod shape extending along one or a direction. The light emitting element LD may have one or an end portion and the other or another end portion along the one or a direction.

In an embodiment, one of the first and second semiconductor layers 11 and 13 may be disposed at the one end portion of the light emitting element LD, and the other of the first and second semiconductor layers 11 and 13 may be disposed at the other end portion of the light emitting element LD.

In an embodiment, the light emitting element LD may be a rod type light emitting diode manufactured in a substantially rod shape. The substantially rod shape may include a rod-like shape or bar-like shape, which may be longer in its length direction (for example, its aspect ratio may be greater than about 1) than in its width direction, such as a cylinder or a polyprism, and the shape of its section is not particularly limited.

In an embodiment, the light emitting element LD may be a micro light emitting diode (LED) having a size of a micrometer (μm). For example, the length of one or a side of the light emitting element may be about 100 μm or less, but the disclosure is not limited thereto. For example, the size of the light emitting element LD may be variously modified according to design conditions of various types of devices, for example, a display device, and the like, which may use, as a light source, a light emitting apparatus using the light emitting element LD.

The first semiconductor layer 11 may include at least one p-type semiconductor material. For example, the first semiconductor layer 11 may include at least one semiconductor material among InAlGaN, GaN, AlGaN, InGaN, AlN, and InN, and may include a P-type semiconductor material doped with a first conductive dopant such as Mg. However, the material constituting the first semiconductor layer 11 is not limited thereto. As an example, various materials may constitute the first semiconductor layer 11.

The intermediate layer 12 may be disposed on the first semiconductor layer 11, and may be formed in a single or multiple quantum well structure. In an embodiment, a clad layer (not shown) doped with a conductive dopant may be formed or disposed on the top and/or the bottom of the intermediate layer 12. In an example, the clad layer may be formed as an AlGaN layer or InAlGaN layer. In an embodiment, a material such as AlGaN or AlIn—GaN may be used to form the intermediate layer 12. As an example, the intermediate layer 12 may be formed of various materials. The intermediate layer 12 may be disposed between the first semiconductor layer 11 and the second semiconductor layer 13 which will be described later.

In a case that a voltage which may be a threshold voltage or higher may be applied to both ends of the light emitting element LD, the light emitting element LD may emit light as electron-hole pairs are combined in the active layer 12. The light emission of the light emitting element LD is controlled using such a principle, so that the light emitting element LD may be used as a light source for various light emitting apparatuses, including a pixel of a display device.

The second semiconductor layer 13 is disposed on the intermediate layer 12, and may include a semiconductor material having a type different from that of the first semiconductor layer 11. In an example, the second semiconductor layer 13 may include at least one n-type semiconductor material. For example, the second semiconductor layer 13 may include at least one semiconductor material among InAlGaN, GaN, AlGaN, InGaN, AlN, and InN, and may include an n-type semiconductor layer doped with a second conductive dopant such as Si, Ge or Si. However, the material constituting the second semiconductor layer 13 is not limited thereto. In an embodiment, a length of the second semiconductor layer 13 may be longer than that of the first semiconductor layer 11.

In an embodiment, the light emitting element LD may include an insulative film INF provided or disposed on a surface thereof. The insulative film INF may be formed or disposed on the surface of the light emitting element LD to at least surround the outer circumference of the intermediate layer 12. As an example, the insulative film INF may surround one or an area of the first semiconductor layer 11 and the second semiconductor layer 13.

In an embodiment, the insulative film INF may expose both the end portions of the light emitting element LD. For example, the insulative film INF may not cover or overlap one end of the first semiconductor layer 11 and the second semiconductor layer 13, which may be located or disposed at both the opposite ends of the light emitting element LD in the length direction, for example, two planes (for example, an upper surface and a lower surface) of a cylinder, but may expose the one end of the first semiconductor layer 11 and the second semiconductor layer 13. In an embodiment, the insulative film INF may expose both end portions of the light emitting element LD, which may have different polarities, and side portions of the first and second semiconductor layers 11 and 13 adjacent to the both the end portions.

In an embodiment, the insulative film INF may include at least one insulating material among silicon oxide (SiOx), silicon nitride (SiNx), silicon oxynitride (SiON), aluminum oxide (AlOx), and titanium dioxide ($TiO_2$), and may be formed as a single layer or a multi-layer (for example, a double layer formed of aluminum oxide (AlOx) and silicon oxide (SiOx)). However, the disclosure is not necessarily limited thereto.

In an embodiment, the light emitting element LD may include an additional component, in addition to the first semiconductor layer 11, the intermediate layer 12, the second semiconductor layer 13, and/or the insulative film INF. For example, the light emitting element LD may include at least one phosphor layer, at least one active layer, at least one semiconductor material layer, and/or at least one electrode layer, which may be disposed at one end of the first semiconductor layer 11, the intermediate layer 12, and/or the second semiconductor layer 13.

Although a case where the light emitting element LD is applied to the following embodiments is described as an example, those skilled in the art may apply various types of light emitting elements to the embodiments.

Figure 3:
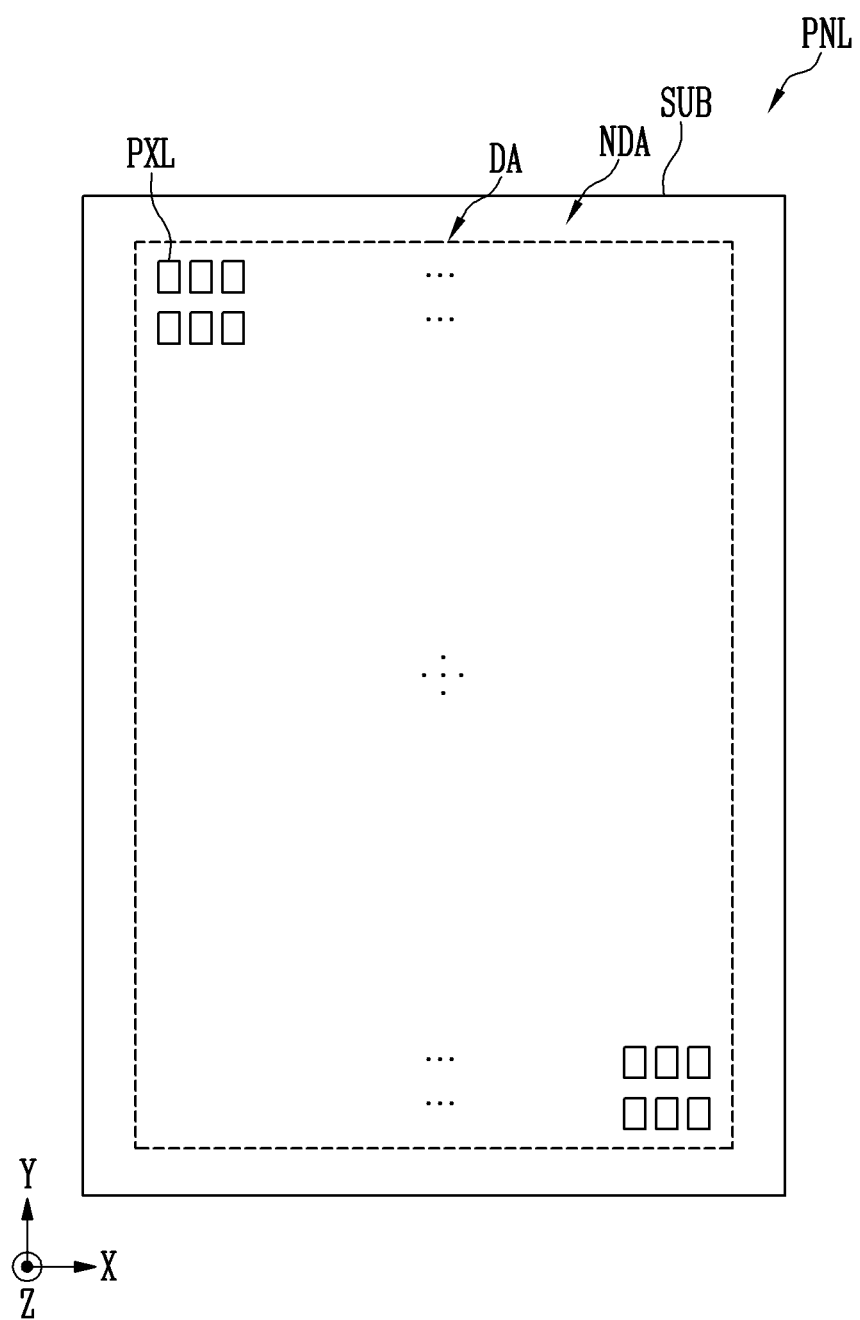

FIG. 3 is a plan view illustrating a display device in accordance with an embodiment. FIG. 3 illustrates a display device, as an example, a display panel PNL provided or disposed in the display device, as an example of a device which may use the above-described light emitting element LD as a light source.

Referring to FIG. 3, the display panel PNL may include a substrate SUB and a plurality of pixels PXL disposed on the substrate SUB in a first direction (X) and a second direction (Y). A third direction (Z) may represent the thickness direction of the display device. By way of example, the display panel PNL and the substrate SUB may include a display area DA in which an image may be displayed and a non-display area NDA as well as the display area DA. In an embodiment, the display area DA may be disposed in a central area of the display panel PNL, and the non-display area NDA may be disposed along an edge of the display panel PNL to surround or to be adjacent to the display area DA. However, the positions of the display area DA and the non-display area NDA are not limited thereto, and may be changed.

The substrate SUB may constitute a base member of the display panel PNL. For example, the substrate SUB may constitute a base member of a lower panel (for example, a lower plate of the display panel PNL).

In an embodiment, the substrate SUB may be a rigid substrate or a flexible substrate, and the material or property of the substrate SUB is not particularly limited. In an example, the substrate SUB may be a rigid substrate made of glass or tempered glass, or a flexible substrate formed as a thin film made of plastic or metal. Also, the substrate SUB may be a transparent substrate, but the disclosure is not limited thereto. In an example, the substrate SUB may be a translucent substrate, an opaque substrate, or a reflective substrate.

One or an area on the substrate SUB may be defined as the display area DA such that the plurality of pixels PXL may be arranged or disposed therein, and the other area of the substrate SUB may be defined as the non-display area NDA. Various lines and/or a built-in circuit unit, electrically connected to the pixels PXL of the display area DA, may be disposed in the non-display area NDA.

Each of the plurality of pixels PXL may include at least one light emitting element LD driven by a corresponding scan signal and a corresponding data signal, for example, at least one light emitting diode in accordance with an embodiment shown in FIGS. 1 and 2. For example, each of the plurality of pixels PXL may include a plurality of light emitting diodes which may have a size small to a degree of micro scales and may be electrically connected in parallel and/or series to each other. The plurality of light emitting diodes may constitute a light source of the pixel PXL.

Although an embodiment in which the pixels PXL may be arranged or disposed in a stripe form in the display area DA has been illustrated in FIG. 3, the disclosure is not necessarily limited thereto. For example, the pixels PXL may be arranged or disposed in various pixel arrangements including a pentile form.

Figure 4:
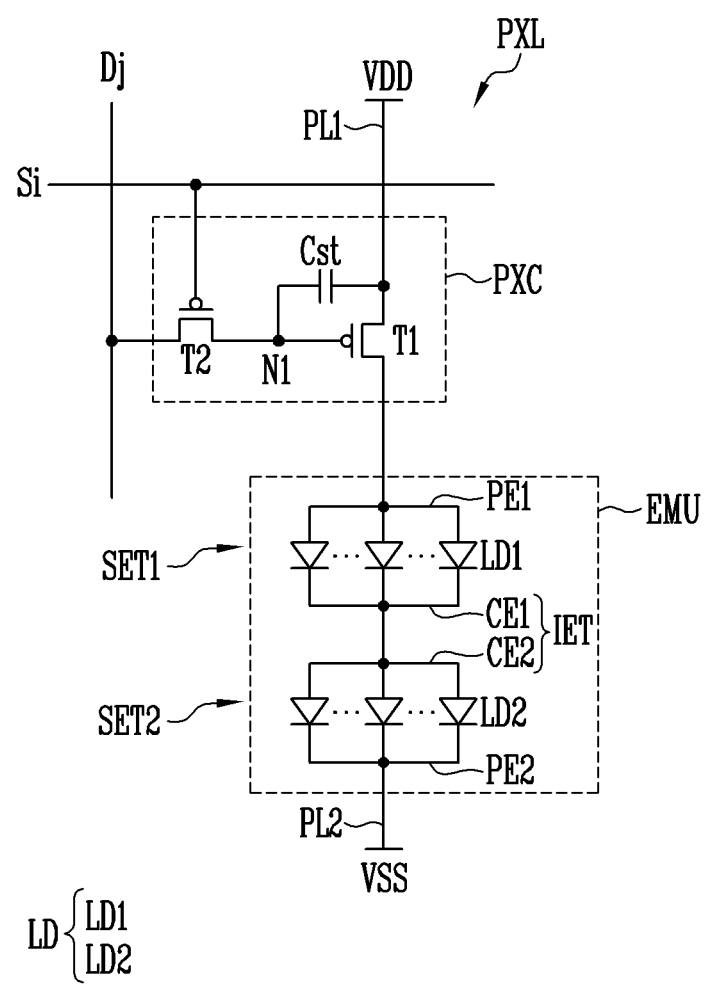
Figure 5:
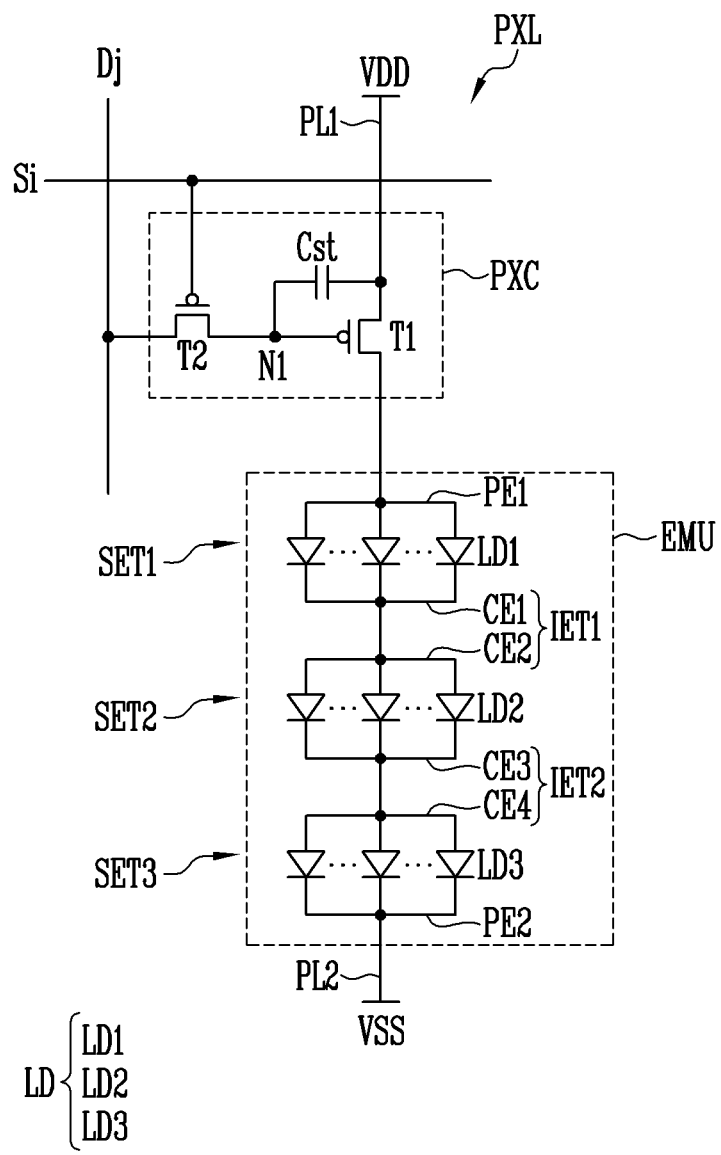

FIGS. 4 and 5 are equivalent circuit diagrams illustrating a pixel in accordance with an embodiment. For example, FIGS. 4 and 5 illustrate different embodiments of a pixel PXL applicable to an active display device. However, the types of the pixel PXL and the display device, to which an embodiment are applicable, are not limited thereto.

Referring to FIGS. 4 and 5, each of a plurality of pixels PXL may include a light emitting unit EMU which may generate light with a luminance corresponding to a data signal. Also, the pixel PXL may include a pixel circuit PXC for driving the light emitting unit EMU.

The light emitting unit EMU may include a plurality of light emitting elements LD electrically connected between a first power line PL1 to which a voltage of a first driving power source VDD may be applied and a second power line PL2 to which a voltage of a second driving power source VSS may be applied.

For example, the light emitting unit EMU may include a first pixel electrode PE1 electrically connected to the first driving power source VDD via the pixel circuit PXC and the first power line PL1, a second pixel electrode PE2 electrically connected to the second driving power source VSS via the second power line PL2, and the plurality of light emitting elements electrically connected to each other in a same direction between the first pixel electrode PE1 and the second pixel electrode PE2. In an embodiment, the first pixel electrode PE1 may be an anode electrode, and the second pixel electrode PE2 may be a cathode electrode. The first driving power source VDD and the second driving power source VSS may have different potentials. In an example, the first driving power source VDD may be set as a high-potential power source, and the second driving power source VSS may be set as a low-potential power source.

The light emitting elements LD of the light emitting unit EMU may emit light with a luminance corresponding to a driving current supplied through a corresponding pixel circuit PXC. For example, the pixel circuit PXC may supply, to the light emitting unit EMU, a driving current corresponding to a grayscale value of corresponding frame data during each frame period. The driving current supplied to the light emitting unit EMU may be divided to flow through the light emitting elements LD. Accordingly, the light emitting unit EMU may emit light with a luminance corresponding to the driving current while each light emitting element LD may emit light with a luminance corresponding to a current flowing therethrough.

The pixel circuit PXC may be electrically connected to a scan line Si and a data line Dj of a corresponding pixel PXL. In an example, in a case that assuming that a pixel PXL is disposed on an ith (i is a natural number) row and a jth (j is a natural number) column of the display area DA, the pixel circuit PXC of the pixel PXL may be electrically connected to an ith scan line Si and a jth data line Dj of the display area DA. In an embodiment, the pixel circuit PXC may include first and second transistors T1 and T2 and a storage capacitor Cst. However, the structure of the pixel circuit PXC is not limited to the embodiments shown in FIGS. 4 and 5.

A first terminal of the second transistor T2 (switching transistor) may be electrically connected to the jth data line Dj, and a second terminal of the second transistor T2 may be electrically connected to a first node N1. The first terminal and the second terminal of the second transistor T2 may be different terminals. For example, in a case that the first terminal may be a source electrode, the second terminal may be a drain electrode. As an example, a gate electrode of the second transistor T2 may be electrically connected to the ith scan line Si. The second transistor T2 may be turned on when a scan signal having a voltage (for example, a low voltage) at which the second transistor T2 may be turned on may be supplied from the ith scan line Si, to electrically connect the jth data line Dj and the first node N1. A data signal of a corresponding frame may be supplied to the jth data line Dj. Accordingly, the data signal may be transferred to the first node N1. The data signal transferred to the first node N1 may be charged in the storage capacitor Cst.

A first terminal of the first transistor T1 (driving transistor) may be electrically connected to the first driving power source VDD, and a second terminal of the first transistor T1 may be electrically connected to the first pixel electrode PE1 of the light emitting elements LD. A gate electrode of the first transistor T1 may be electrically connected to the first node N1. The first transistor T1 may control an amount of driving current supplied to the light emitting elements LD, corresponding to a voltage of the first node N1.

One electrode of the storage capacitor Cst may be electrically connected to the first driving power source VDD, and the other electrode of the storage capacitor Cst may be electrically connected to the first node N1. The storage capacitor Cst may charge a voltage corresponding to the data signal supplied to the first node N1, and maintain the charged voltage until a data signal of a next frame may be supplied.

Meanwhile, although the pixel circuit PXC including the second transistor T2 for transferring a data signal to the pixel PXL, the storage capacitor Cst for storing the data signal, and the first transistor T1 for supplying a driving current to the light emitting elements LD has been illustrated in FIGS. 4 and 5, the disclosure is not necessarily limited thereto. For example, the pixel circuit PXC may additionally include at least one transistor such as a transistor for compensating for a threshold voltage of the first transistor T1, a transistor for initializing the first node N1, and/or a transistor for controlling an emission time of the light emitting elements LD, or other circuit elements such as a boosting capacitor for boosting the voltage of the first node N1.

As an example, although a case where all the transistors, for example, the first and second transistors T1 and T2 included in the pixel circuit PXC are implemented with a P-type transistor is illustrated in FIGS. 4 and 5, the disclosure is not necessarily limited thereto. For example, at least one of the first and second transistors T1 and T2 included in the pixel circuit PXC may be implemented with an N-type transistor. In an embodiment, the pixel circuit PXC may be electrically connected to at least another scan line. Also, the pixel circuit PXC may be electrically connected to a third power source (for example, an initialization power source) in addition to the first and second driving power sources VDD and VSS.

The light emitting elements LD may be divided into, for example, two serial stages SET1 and SET2 to be electrically connected to each other as shown in FIG. 4. Each of the serial stages SET1 and SET2 may include two electrodes and at least one light emitting element LD electrically connected between the two electrodes.

For example, a first serial stage SET1 may include a first pixel electrode PE1, a first connection electrode CE1, and at least one first light emitting element LD1 electrically connected between the first pixel electrode PE1 and the first connection electrode CE1, and a second serial stage SET2 may include a second connection electrode CE2, a second pixel electrode PE2, and at least one second light emitting element LD2 electrically connected between the second connection electrode CE2 and the second pixel electrode PE2. The first and second serial stages SET1 and SET2 may be electrically connected in series. The light emitting elements LD1 of the first serial stage SET1 may be electrically connected in parallel, and the light emitting elements LD2 of the second serial stage SET2 may be electrically connected in parallel.

A first electrode, for example, the first pixel electrode PE1 of the light emitting unit EMU may be an anode electrode of the light emitting unit EMU. As an example, a last electrode, for example, the second pixel electrode PE2 of the light emitting unit EMU may be a cathode electrode of the light emitting unit EMU.

The other electrodes, for example, the first connection electrode CE1 and the second connection electrode CE2 of the light emitting unit EMU may constitute an intermediate electrode IET. For example, the first connection electrode CE1 and the second connection electrode CE2 may be integrally or non-integrally connected to each other, to constitute the intermediate electrode IET. The first connection electrode CE1 and the second connection electrode CE2 may integrated or integral and considered as one intermediate electrode IET.

Although an embodiment in which the light emitting elements LD are electrically connected in the two serial stages has been illustrated in FIG. 4, the disclosure is not necessarily limited thereto. In an embodiment, the light emitting elements LD may be electrically connected in multiple stages, for example, three or more serial stages. For example, the light emitting elements LD may be divided into three serial stages SET1, SET2, and SET3 (referring to FIG. 5) to be electrically connected to each other in a series-parallel mixed or hybrid structure. Each of the serial stages SET1, SET2, and SET3 may include two electrodes and at least one light emitting element LD electrically connected between the two electrodes. The three serial stages SET1, SET2 and SET3 may be electrically connected in series. The light emitting elements LD1 may be electrically connected in parallel in the first serial stage SET1, the light emitting elements LD2 may be electrically connected in parallel in the second serial stage SET2, and the light emitting elements LD3 may be electrically connected in parallel in the third serial stage SET3. Thus, the light emitting elements LD1, LD2 and LD3 may be connected each other in the series-parallel mixed or hybrid structure.

For example, a first serial stage SET1 may include a first pixel electrode PE1, a first connection electrode CE1, and at least one first light emitting element LD1 electrically connected between the first pixel electrode PE1 and the first connection electrode CE1, and a second serial stage SET2 may include a second connection electrode CE2, a third connection electrode CE3, and at least one second light emitting element LD2 electrically connected between the second connection electrode CE2 and the third connection electrode CE3. Similarly, a third serial stage SET3 may include a fourth connection electrode CE4, a second pixel electrode PE2, and at least one third light emitting element LD3 electrically connected between the fourth connection electrode CE4 and the second pixel electrode PE2.

A first electrode, for example, the first pixel electrode PE1 of the light emitting unit EMU may be an anode electrode of the light emitting unit EMU. As an example, a last electrode, for example, the second pixel electrode PE2 of the light emitting unit EMU may be a cathode electrode of the light emitting unit EMU.

The other electrodes, for example, the first connection electrode CE1, the second connection electrode CE2, the third connection electrode CE3, and the fourth connection electrode CE4 of the light emitting unit EMU may constitute intermediate electrodes IET1 and IET2. For example, the first connection electrode CE1 and the second connection electrode CE2 may be integrally or non-integrally connected to each other, to constitute a first intermediate electrode IET1. Similarly, the third connection electrode CE3 and the fourth connection electrode CE4 may be integrally or non-integrally connected to each other, to constitute a second intermediate electrode IET2. The first connection electrode CE1 and the second connection electrode CE2 may be integrated or integral and considered as one first intermediate electrode IET1, and the third connection electrode CE3 and the fourth connection electrode CE4 may be integrated or integral and considered as one second intermediate electrode IET2.

In a case that assuming that the light emitting unit EMU may be formed by using, as effective light sources, light emitting elements LD under the same condition (for example, the same size and/or the same number), power efficiency may be improved in a case that the light emitting elements LD may be electrically connected in a series or a series-parallel mixed or hybrid structure. For example, in the light emitting unit EMU in which the light emitting elements LD may be electrically connected in series or a series-parallel mixed or hybrid structure, a high luminance may be expressed by using the same current, as compared with a light emitting unit (not shown) in which the light emitting elements LD may be electrically connected only in parallel. Also, in the light emitting unit EMU in which the light emitting elements LD may be electrically connected in series or a series-parallel mixed or hybrid structure, the same luminance may be expressed by using a low driving current, as compared with the light emitting unit in which the light emitting elements LD may be electrically connected in parallel.

In the pixel PXL in which the light emitting elements LD may be electrically connected in a series-parallel mixed or hybrid structure, although an open failure may occur in some light emitting elements LD or although a short failure may occur in some serial stages, a predetermined luminance may be expressed through light emitting elements LD of the other serial stage. Hence, the probability that a dark spot failure may occur in the pixel PXL may be reduced.

Figure 6:
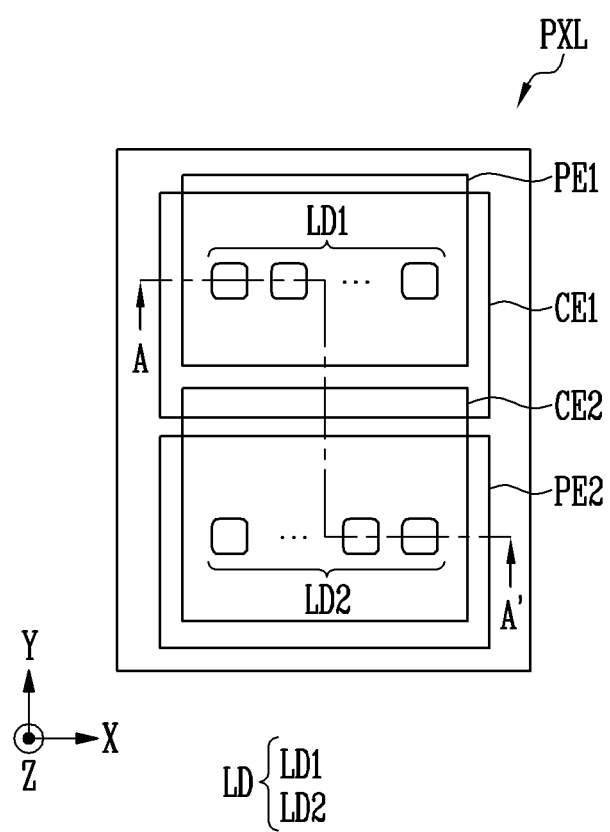
Figure 7:
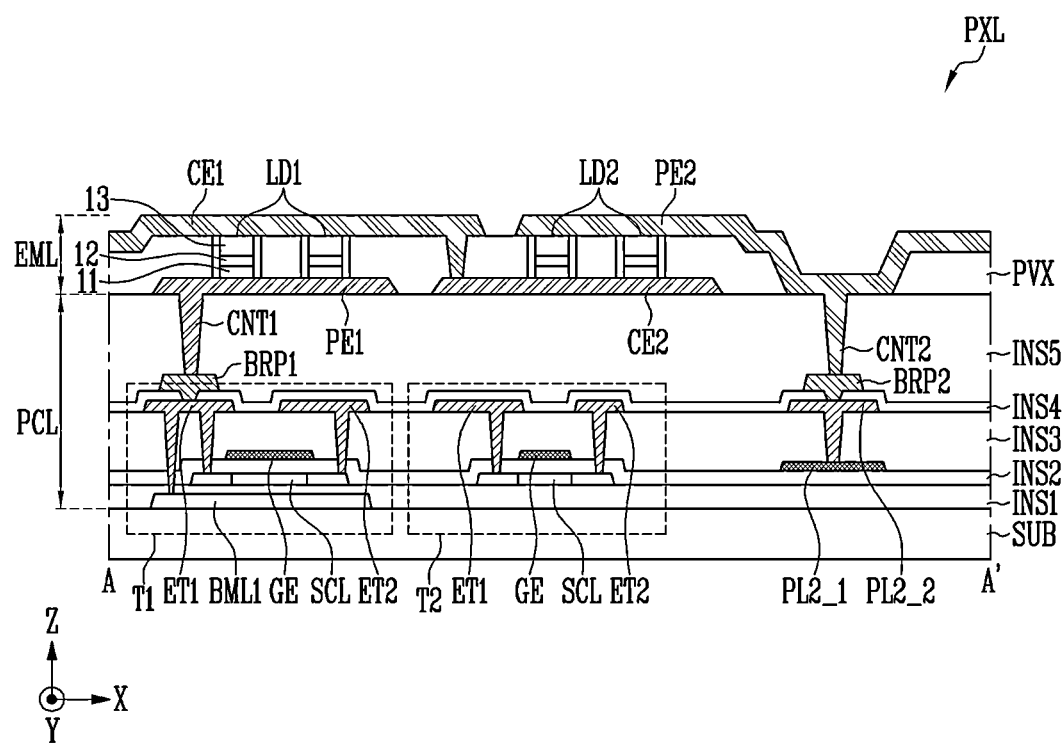

FIG. 6 is a schematic plan view of a pixel in accordance with an embodiment. FIG. 7 is a schematic cross-sectional view taken along line A-A' shown in FIG. 6.

In FIG. 6, a structure of each pixel PXL is schematically illustrated based on a light emitting unit EMU of the pixel PXL. However, in an embodiment, each pixel PXL may selectively include circuit elements (for example, a plurality of circuit elements constituting each pixel circuit PXC) electrically connected to the light emitting unit EMU.

Referring to FIGS. 6 and 7, each pixel PXL may include a pixel circuit layer PCL and a light emitting element layer EML, which may be disposed on a substrate SUB.

The pixel circuit layer PCL may include a first conductive layer, a first insulating layer INS1, a semiconductor layer, a second insulating layer INS2, a second conductive layer, a third insulating layer INS3, a third conductive layer, a fourth insulating layer INS4, a fourth conductive layer, and a fifth insulating layer INS5.

The first conductive layer may be disposed on the substrate SUB, and may include a back gate electrode BML1. The back gate electrode BML1 may constitute a back gate electrode of a first transistor T1. The first transistor T1 may be the first transistor T1 described with reference to FIGS. 4 and 5. Meanwhile, a second transistor T2 may be the second transistor T2 described with reference to FIGS. 4 and 5, and may be substantially identical or similar to the first transistor T1 except the back gate electrode BML1. Therefore, the pixel circuit layer PCL will be described based on the first transistor T1.

In an embodiment, a buffer layer may be disposed between the first conductive layer and the substrate SUB. The buffer layer may be disposed on the entire surface of the substrate SUB. The buffer layer may prevent diffusion of an impurity ion, prevent penetration of moisture or external gas, and perform a surface planarization function. The buffer layer may include silicon nitride, silicon oxide, silicon oxynitride, or the like within the spirit and the scope of the disclosure.

The first insulating layer INS1 may be disposed on the substrate SUB and the first conductive layer. The first insulating layer INS1 may be roughly disposed throughout the entire surface of the substrate SUB.

The first insulating layer INS1 may include an inorganic insulating material such as silicon oxide, silicon nitride, silicon oxynitride, hafnium oxide, aluminum oxide, titanium oxide, tantalum oxide, or zinc oxide, or an organic insulating material such as acrylic resin, epoxy resin, phenolic resin, polyamides resin, polyimides resin, unsaturated polyesters resin, poly-phenylene ethers resin, poly-phenylene sulfides resin, and benzocyclobutenes resin. The first insulating layer INS1 may be a single layer or a multi-layer in which layers made of different materials may be stacked.

The semiconductor layer may be disposed on the first insulating layer INS1. The semiconductor layer may be an active layer forming a channel of the first transistor T1. The semiconductor layer may include a source region and a drain region, which may be in electrical contact with a first transistor electrode (or source electrode) and a second transistor electrode (or drain electrode), which will be described later. A region between the source region and the drain region may be a channel region.

The semiconductor layer may include a semiconductor pattern SCL. The semiconductor pattern SCL may constitute the channel of the first transistor T1 (or the second transistor T2).

The semiconductor pattern SCL may include an oxide semiconductor. The channel region of the semiconductor pattern SCL may be a semiconductor pattern undoped with an impurity, and may be an intrinsic semiconductor. As an example, each of the source region and the drain region of the semiconductor pattern SCL may be a semiconductor pattern doped with the impurity. An n-type impurity may be used as the impurity, by way of non-limiting example.

The second insulating layer INS2 (or gate insulating layer) may be disposed on the semiconductor layer and the first insulating layer INS1. The second insulating layer INS2 may be roughly disposed on the entire surface of the substrate SUB. The second insulating layer INS2 may be a gate insulating layer having a gate insulating function. Similar to the first insulating layer INS1, the second insulating layer INS2 may include an inorganic insulating material such as a silicon compound or metal oxide.

The second conductive layer may be disposed on the second insulating layer INS2. The second conductive layer may include a gate electrode GE (or first conductive pattern) and a first sub-power line PL2_1. Also, the second conductive layer may include lines (for example, a scan line and a gate line) which may be electrically connected to the gate electrode GE of a transistor or constitute the gate electrode GE, capacitor electrodes, and the like within the spirit and the scope of the disclosure. The gate electrode GE may be disposed to overlap the semiconductor pattern SCL, and constitute a gate electrode of the first transistor T1. The second driving power source VSS described with reference to FIGS. 4 and 5 may be applied to the first sub-power line PL2_1.

The second conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer may have a single- or multi-layered structure.

The third insulating layer INS3 (or interlayer insulating layer) may be disposed on the second conductive layer, and be roughly disposed throughout the entire surface of the substrate SUB. The third insulating layer INS3 may be an interlayer insulating layer which may function to insulate the second conductive layer and the third conductive layer from each other.

The third insulating layer INS3 may include an inorganic insulating material such as silicon oxide, silicon nitride, silicon oxynitride, hafnium oxide, aluminum oxide, titanium oxide, tantalum oxide, or zinc oxide, or an organic insulating material such as acrylic resin, epoxy resin, phenolic resin, polyamides resin, polyimides resin, unsaturated polyesters resin, poly-phenylene ethers resin, poly-phenylene sulfides resin, and benzocyclobutenes resin. The third insulating layer INS3 may be a single layer or a multi-layer in which layers made of different materials may be stacked.

The third conductive layer may be disposed on the third insulating layer INS3. The third conductive layer may include a first transistor electrode ET1 (or second conductive pattern), a second transistor electrode ET2 (or third conductive pattern), and a second sub-power line PL2_2. Also, the third conductive layer may include lines (for example, a data line) electrically connected to at least one of the first transistor electrode ET1 and the second transistor electrode ET2, and power lines.

The first transistor electrode ET1 may overlap a partial region of the semiconductor pattern SCL (for example, the source region of the first transistor T1), and may be electrically connected to a partial region of the semiconductor pattern SCL, which may be exposed by a contact hole. The first transistor electrode ET1 may constitute a first electrode (for example, a source electrode) of the first transistor T1.

Similarly, the second transistor electrode ET2 may overlap a partial region of the semiconductor pattern SCL (for example, a drain region of the first transistor T1), and may be electrically connected to a partial region of the semiconductor pattern SCL, which may be exposed by a contact hole. The second transistor electrode ET2 may constitute a second electrode (for example, a drain electrode) of the first transistor T1.

The second sub-power line PL2_2 may be electrically connected to the first sub-power line PL2_1 exposed by a contact hole. The second sub-power line PL2_2 along with the first sub-power line PL2_1 may constitute a power line for supplying the second driving power source VSS to the pixel PXL.

Similarly to the second conductive layer, the third conductive layer may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer may have a single- or multi-layered structure.

The fourth insulating layer INS4 may be disposed on the third conductive layer, and be roughly disposed throughout the entire surface of the substrate SUB. The fourth insulating layer INS4 may be an interlayer insulating layer which may function to insulate the third conductive layer and the fourth conductive layer from each other. Similarly to the third insulating layer INS3, the fourth insulating layer INS4 may include an inorganic insulating material or an organic insulating material.

The fourth conductive layer may be disposed on the fourth insulating layer INS4. The fourth conductive layer may include a first bridge pattern BRP1 and a second bridge pattern BRP2.

The first bridge pattern BRP1 may overlap the first transistor electrode ET1 of the first transistor T1, and may be electrically connected to the first transistor electrode ET1 exposed by a contact hole. The first bridge pattern BRP1 may electrically connect the first transistor T1 and a first pixel electrode PE1 which will be described later.

The second bridge pattern BRP2 may overlap the second sub-power line PL2_2, and may be electrically connected to the second sub-power line PL2_2 exposed through a contact hole. The second bridge pattern BRP2 may electrically connect the second sub-power line PL2_2 and a second pixel electrode PE2 which will be described later.

The fifth insulating layer INS5 may be disposed on the fourth conductive layer and the fourth insulating layer INS4. The fifth insulating layer INS5 may be provided in a form including an organic insulating layer, an inorganic insulating layer, or the organic insulating layer disposed on the inorganic insulating layer.

A first contact hole CNT1 exposing the first bridge pattern BRP1 and a second contact hole CNT2 exposing the second bridge pattern BRP2 may be formed in the fifth insulating layer INS5.

The light emitting element layer EML may be disposed on the fifth insulating layer INS5.

The light emitting element layer EML may include a first electrode layer including the first pixel electrode PE1 and the second connection electrode CE2, a second electrode layer including the first connection electrode CE1 and the second pixel electrode PE2 disposed on the first electrode layer including the first pixel electrode PE1 and the second connection electrode CE2, and a plurality of light emitting elements LD1 and LD2 disposed between the first electrode layer PE1 and CE2 and the second electrode layer CE1 and PE2.

The first electrode layer PE1 and CE2 may be disposed on the fifth insulating layer INS5 of the pixel circuit layer PCL. The first electrode layer PE1 and CE2 may have a stacked layer structure in which a material layer such as copper (Cu), gold (Au), silver (Ag), magnesium (Mg), aluminum (Al), platinum (Pt), lead (Pb), nickel (Ni), neodymium (Nd), iridium (Ir), chromium (Cr), lithium (Li), calcium (Ca) or any mixture thereof, and a material layer having a high work function, such as indium tin oxide (ITO), indium zinc oxide (IZO), zinc oxide (ZnO) or indium oxide ($In_2O_3$) may be stacked. However, the disclosure is not necessarily limited thereto.

The first electrode layer PE1 and CE2 may include the above-described first pixel electrode PE1 and a second connection electrode CE2. The first pixel electrode PE1 and the second connection electrode CE2 may be disposed to be spaced apart from each other. The first pixel electrode PE1 may be electrically connected to the above-described first bridge pattern BRP1 through a first contact hole CNT1 penetrating the fifth insulating layer INS5, and may be electrically connected to the first transistor electrode ET1 of the first transistor T1 through the first bridge pattern BRP1. The first pixel electrode PE1 may be an anode electrode of each pixel PXL.

A plurality of light emitting elements LD1 and LD2 and a protective layer PVX may be disposed on the first electrode layer PE1 and CE2.

The plurality of light emitting elements LD1 and LD2 may include first light emitting elements LD1 disposed on the first pixel electrode PE1 and second light emitting elements LD2 disposed on the second connection electrode CE2. The first light emitting elements LD1 may be disposed between the first pixel electrode PE1 and a first connection electrode CE1. One end of each of the first light emitting elements LD1 may be electrically connected to the first pixel electrode PE1, and the other end of each of the first light emitting elements LD1 may be electrically connected to the first connection electrode CE1. For example, a first semiconductor layer 11 of each of the first light emitting elements LD1 may be electrically connected to the first pixel electrode PE1, and a second semiconductor layer 13 of each of the first light emitting elements LD1 may be electrically connected to the first connection electrode CE1. As an example, the second light emitting elements LD2 may be disposed between the second connection electrode CE2 and the second pixel electrode PE2. One end of each of the second light emitting elements LD2 may be electrically connected to the second connection electrode CE2, and the other end of each of the second light emitting elements LD2 may be electrically connected to the second pixel electrode PE2. For example, a first semiconductor layer 11 of each of the second light emitting elements LD2 may be electrically connected to the second connection electrode CE2, and a second semiconductor layer 13 of each of the second light emitting elements LD2 may be electrically connected to the second pixel electrode PE2. The first light emitting elements LD1 may be electrically connected in parallel between the first pixel electrode PE1 and the first connection electrode CE1, to constitute a first serial stage (SET1 shown in FIG. 4, for example), and the second light emitting elements LD2 may be electrically connected in parallel between the second connection electrode CE2 and the second pixel electrode PE2, to constitute a second serial stage (SET2 shown in FIG. 4, for example). The first serial stage SET1 and the second serial stage SET2 may be electrically connected in series with respect to each other.

In a case that the light emitting elements LD may be electrically connected in a series-parallel mixed or hybrid structure, although an open failure may occur in some light emitting elements LD or although a short failure may occur in some serial stages SET1 and SET2, the probability that a dark spot failure will occur in the pixel PXL may be reduced, which has been described above.

The protective layer PVX may be disposed to surround the light emitting elements LD. The protective layer PVX may function to prevent a step difference caused by the light emitting element, for example. The protective layer PVX may include an organic insulating material such as acrylic resin, epoxy resin, phenolic resin, polyamides resin, polyimides resin, unsaturated polyesters resin, poly-phenylene ethers resin, poly-phenylene sulfides resin, and benzocyclobutenes resin, but the disclosure is not necessarily limited thereto.

The second electrode layer CE1 and PE2 may be disposed on the light emitting elements LD and the protective layer PVX. The second electrode layer CE1 and PE2 may be formed as a metal thin film having a low work function, such as Li, Ca, LiF/Ca, LiF/Al, Al, Mg, Ag, Pt, Pd, Ni, Au, Nd, Ir, Cr, BaF, Ba, or any compound or mixture thereof (for example, any mixture of Ag and Mg). Also, the second electrode layer CE1 and PE2 may include a transparent metal oxide layer disposed on a material layer having the low work function. Accordingly, the second electrode layer CE1 and PE2 may enable light emitted from the light emitting element LD to be transmitted therethrough.

The second electrode layer CE1 and PE2 may include the above-described first connection electrode CE1 and the above-described second pixel electrode PE2. The first connection electrode CE1 and the second pixel electrode PE2 may be disposed to be spaced apart from each other. The first connection electrode CE1 may be disposed on the first pixel electrode PE1 and the first light emitting elements LD1. The first connection electrode CE1 may be directly disposed on the second semiconductor layer 13 on each of the first light emitting elements LD1. As an example, the second pixel electrode PE2 may be disposed on the second connection electrode CE2 and the second light emitting elements LD2. The second pixel electrode PE2 may be directly disposed on the second semiconductor layer 13 of each of the second light emitting elements LD2. The first connection electrode CE1 may be electrically connected to the second connection electrode CE2. The first connection electrode CE1 may be in electrical contact with the second connection electrode CE2 through a contact hole penetrating the above-described protective layer PVX. Accordingly, the first light emitting elements LD1 and the second light emitting elements LD2 may be electrically connected to each other. The second pixel electrode PE2 may be electrically connected to the above-described second bridge pattern BRP2 through the second contact hole CNT2 penetrating the fifth insulating layer INS5, and may be electrically connected to the first and second sub-power lines PL2_1 and PL2_2 through the second bridge pattern BRP2. The second pixel electrode PE2 may be a cathode electrode of each pixel PXL.

According to the display device in accordance with the above-described embodiment, the light emitting elements LD may be electrically connected in a series-parallel mixed or hybrid structure, so that although an open failure may occur in some light emitting elements LD or although a short failure may occur in some serial stages SET1 and SET2, the probability that a dark spot failure will occur in the pixel PXL may be minimized.

Hereinafter, an embodiment will be described. In the following embodiment, components identical to those described above are designated by like reference numerals, and overlapping descriptions may be omitted or simplified.

Figure 8:
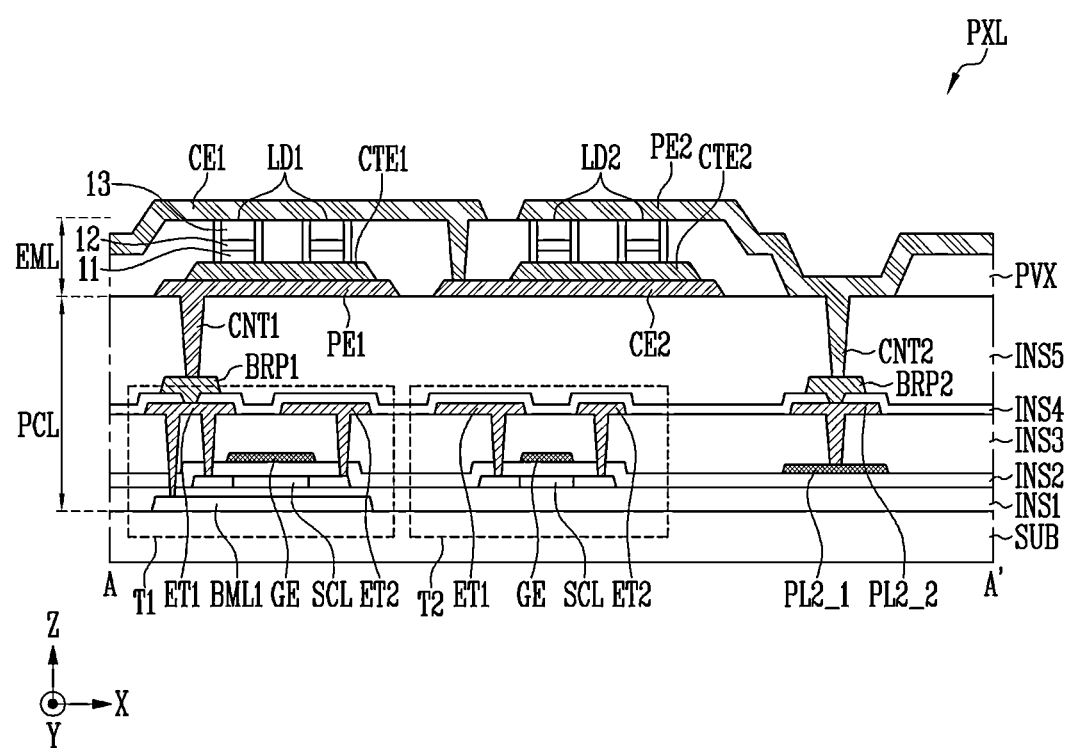

FIG. 8 is a schematic cross-sectional view of a pixel in accordance with an embodiment. FIG. 8 illustrates a section corresponding to the line A-A' shown in FIG. 6.

Referring to FIG. 8, a display device in accordance with an embodiment may be different from an embodiment shown in FIGS. 1 to 7, in that the display device may include contact electrodes CTE1 and CTE2 disposed on the bottom of the light emitting elements LD.

By way of example, the contact electrodes CTE1 and CTE2 may be disposed between the first electrode layer PE1 and CE2 and the light emitting elements LD. The contact electrodes CTE1 and CTE2 may include a first contact electrode CTE1 disposed between the first pixel electrode PE1 and the first light emitting elements LD1 and a second contact electrode CTE2 disposed between the second connection electrode CE2 and the second light emitting elements LD2. The first light emitting elements LD1 may be easily attached to the first pixel electrode PE1 through the first contact electrode CTE1. As an example, the second light emitting elements LD2 may be easily attached to the second connection electrode CE2 through the second contact electrode CTE2. The first contact electrode CE1 may be directly disposed between the first pixel electrode PE1 and the first semiconductor layer 11 of each of the first light emitting elements LD1, to be in direct contact with one or a surface of the first pixel electrode PE1 and the first semiconductor layer 11 of each of the first light emitting elements LD1. As an example, the second contact electrode CTE2 may be directly disposed between the second connection electrode CE2 and the first semiconductor layer 11 of each of the second light emitting elements LD2, to be in direct contact with one or a surface of the second connection electrode CE2 and the first semiconductor layer 11 of each of the second light emitting elements LD2. The contact electrodes CTE1 and CTE2 may include metal or metal oxide. For example, the contact electrodes CTE1 and CTE2 may include copper (Cu), gold (Au), chromium (Cr), titanium (Ti), aluminum (Al), nickel (Ni), indium tin oxide (ITO), any oxide or alloy thereof, and the like, but the disclosure is not limited thereto.

In accordance with the disclosure, light emitting elements may be electrically connected in a series-parallel mixed or hybrid structure, so that although an open failure may occur in some light emitting elements or although a short failure may occur in some serial stages, the probability that a dark spot failure will occur in a pixel may be minimized. For example, the light emission efficiency of the display device may be improved.

Embodiments have been disclosed herein, and although specific terms are employed, they are used and are to be interpreted in a generic and descriptive sense only and not for purpose of limitation. In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:
   a plurality of pixels, each of the plurality of pixels includes:
      a first pixel electrode;
      a first connection electrode disposed on the first pixel electrode;
      a second connection electrode spaced apart from the first pixel electrode;
      a second pixel electrode disposed on the second connection electrode;
      a plurality of first light emitting elements disposed between the first pixel electrode and the first connection electrode; and
      a plurality of second light emitting elements disposed between the second connection electrode and the second pixel electrode,
   wherein the first connection electrode is electrically connected to the second connection electrode.

2. The display device of claim 1, wherein the first pixel electrode and the second connection electrode of each of the plurality of pixels are disposed on a same layer.

3. The display device of claim 1, wherein the first connection electrode and the second pixel electrode of each of the plurality of pixels are disposed on a same layer.

4. The display device of claim 1, further comprising:
   an insulating layer disposed over the first pixel electrode and the second connection electrode of each of the plurality of pixels.

5. The display device of claim 4, wherein the first connection electrode of each of the plurality of pixels electrically contacts the second connection electrode of each of the plurality of pixels through a contact hole penetrating the insulating layer.

6. The display device of claim 1, wherein
   the plurality of first light emitting elements constitute a first serial stage in which the plurality of first light emitting elements are electrically connected in parallel between the first pixel electrode and the first connection electrode of each of the plurality of pixels, and
   the plurality of second light emitting elements constitute a second serial stage in which the plurality of second light emitting elements are electrically connected in parallel between the second connection electrode and the second pixel electrode of each of the plurality of pixels.

7. The display device of claim 1, wherein each of the plurality of first light emitting elements includes:
   a first semiconductor layer;
   a second semiconductor layer disposed on the first semiconductor layer; and
   an intermediate layer disposed between the first semiconductor layer and the second semiconductor layer.

8. The display device of claim 7, wherein the first connection electrode of each of the plurality of pixels is directly disposed on the second semiconductor layer of each of the plurality of first light emitting elements.

9. The display device of claim 7, wherein
   the first semiconductor layer of each of the plurality of first light emitting elements is electrically connected to the first pixel electrode of each of the plurality of pixels, and
   the second semiconductor layer of each of the plurality of first light emitting elements is electrically connected to the first connection electrode of each of the plurality of pixels.

10. The display device of claim 7, further comprising:
    a first contact electrode disposed between the first pixel electrode of each of the plurality of pixels and the first semiconductor layer of each of the plurality of first light emitting elements.

11. The display device of claim 1, wherein each of the plurality of second light emitting elements includes:
    a first semiconductor layer;
    a second semiconductor layer disposed on the first semiconductor layer; and
    an intermediate layer disposed between the first semiconductor layer and the second semiconductor layer.

12. The display device of claim 11, wherein the second pixel electrode of each of the plurality of pixels is directly disposed on the second semiconductor layer of each of the plurality of second light emitting elements.

13. The display device of claim 11, wherein
    the first semiconductor layer of each of the plurality of second light emitting elements is electrically connected to the second connection electrode of each of the plurality of pixels, and
    the second semiconductor layer of each of the plurality of second light emitting elements is electrically connected to the second pixel electrode of each of the plurality of pixels.

14. The display device of claim 11, further comprising:
    a second contact electrode disposed between the second connection electrode of each of the plurality of pixels and the first semiconductor layer of each of the plurality of second light emitting elements.

15. The display device of claim 1, further comprising:
a first power line electrically connected to the first pixel electrode of each of the plurality of pixels; and
a second power line electrically connected to the second pixel electrode of each of the plurality of pixels.

\* \* \* \* \*